United States Patent [19]

Liou et al.

[11] Patent Number: 4,956,311
[45] Date of Patent: Sep. 11, 1990

[54] DOUBLE-DIFFUSED DRAIN CMOS PROCESS USING A COUNTERDOPING TECHNIQUE

[75] Inventors: Tian-I Liou; Chih-Sieh Teng, both of San Jose, Calif.

[73] Assignee: National Semiconductor Corporation, Santa Clara, Calif.

[21] Appl. No.: 371,788

[22] Filed: Jun. 27, 1989

[51] Int. Cl.⁵ .......................................... H01L 21/336
[52] U.S. Cl. ........................................ 437/57; 437/34; 437/44; 437/45; 437/953
[58] Field of Search .................... 437/29, 34, 41, 44, 437/45, 56, 57, 58, 200, 953; 357/23.3, 23.4, 42, 44; 148/DIG. 18

[56] References Cited

U.S. PATENT DOCUMENTS

| | | | |
|---|---|---|---|
| 4,314,857 | 2/1982 | Aitken | 148/1.5 |
| 4,356,623 | 11/1982 | Hunter | 29/571 |
| 4,358,890 | 11/1982 | Heller et al. | 29/571 |
| 4,753,898 | 6/1988 | Parrillo et al. | 437/44 |
| 4,775,642 | 10/1988 | Chang et al. | 437/44 |

FOREIGN PATENT DOCUMENTS

| | | | |
|---|---|---|---|
| 0103377 | 6/1984 | Japan | 437/56 |
| 0084859 | 5/1985 | Japan | 437/56 |

OTHER PUBLICATIONS

H. Mikoshiba et al., *Comparison of Drain Structures in n-Channel MOSFETS*, IEEE Trans. on Electron Dev., ED-33, No. 1, Jan. 1986.
J. Agraz-Guerena et al., *Twin-Tub III—A Third Generation CMOS Technology*, IEDM '84, 63-64.
L. C. Parrillo et al., *Twin-Tub CMOS—A Technology for VLSI Circuits*, Reprint-CH1616-2/80/0000-0752, IEEE 1980.
L. C. Parrillo et al., *Twin-Tub CMOS II—An Advanced VLSI Technology*, Reprint-CH1832-5/82/0000-0706, IEEE 1982.
Fair et al., *Modeling Physical Limitations on Junction Scaling for CMOS*, IEEE Trans. on Electron Devices, ED-31, No. 9, Sep. 1984.
Scott et al., *Considerations for Scaled CMOS Source/Drains*, Reprint-CH1708-7/81/0000-0538, IEEE 1981.
R. R. Doering et al., *A High Performance 1 um CMOS Process for VLSI Applications*, IEEE 1985 Custom Integrated Circuits Conference, 196-198.
A. C. Hui et al., *An Oxide Masked P+ Source/Drain Implant for VLSI CMOS*, Reprint-CH1832-5/82/00-00-0698, IEEE 1982.

Primary Examiner—Brian E. Hearn
Assistant Examiner—T. N. Quach
Attorney, Agent, or Firm—Brown, Martin, Haller & McClain

[57] ABSTRACT

The present process comprises the use of a blanket phosphorus (n−) implant coupled with a masked boron (P+) implant to permit the elimination of the conventional N+ implant and the LDD masks. The use of the blanket n− implant and the masked p+ implant allows production of an n− drain region which reduces hot-electron-induced degradation and a low concentration S/D region which is subsequently more easily counter-doped by a high concentration implant. A shallow blanket n+ implant is included prior to the P+ mask step to prevent contact resistance problems. Thereafter in the process of this invention, a salicide is formed at the sources and drains to produce a low sheet resistance in the contacts of the n-channel devices, notwithstanding the absence of the conventional thick n+ layer.

18 Claims, 2 Drawing Sheets

DOUBLE-DIFFUSED DRAIN CMOS PROCESS USING A COUNTERDOPING TECHNIQUE

FIELD OF THE INVENTION

The invention herein relates to the production of CMOS devices. More particularly it relates to a method for production of CMOS devices in which certain masks can be eliminated.

BACKGROUND OF THE INVENTION

A significant limiting factor in current n-channel MOSFETs is hot-electron-induced degradation, because of high channel electric fields and electron impact ionization rates in the micron and sub-micron n-channel devices. In hot electron injection, electrons are injected into the gate oxide by the high electric field created by the short channel region adjacent to the drain. As a result, the threshold voltage of the device is altered. In addition, overlap between the gate electrode and the source and drain results in parasitic capacitance between the diffusion region and the gate. This phenomenon, called Miller capacitance, decreases device speed.

"Lightly doped drain" (LDD) and "double diffused drain" (DDD) structures have been developed to minimize this degradation. Both of these structures are based on the theory that if there is a lightly doped n-surface layer adjacent to the channel, the peak electric field will be reduced and shifted from under the gate so that hot electron-induced degradation will be lessened. However, both pose other types of problems. Production of LDD structures requires the use of an additional mask to prevent LDD phosphorus from implanting into p-channel regions. In both the LDD and DDD structures one must construct a highly doped n+ region to produce low contact resistance at the n-channel source and drain for high-speed circuits.

The production of CMOS (complementary metal-oxide semiconductor) devices requires about eleven masks to produce the sequential layers of oxides, active areas and contacts which form the device. Each step in the device production generally involves a separate mask, except where "blanket" implant and oxidations can be effected. Each mask which must be used adds to the cost and time required to produce the device. Not only is expense incurred in the masking step itself, but the additional handling required for each mask step increases the possibility of defects, resulting in lower yields. The requirement of added mask steps to reduce hot electron effects has provided greater incentive to find other steps for which masks may be eliminated.

Prior research has been directed to techniques for eliminating masks whenever possible or to replace complex mask steps with simpler ones. One technique described involves a source/drain (S/D) counterdoping step to eliminate the S/D implant mask, in which a blanket implant of boron (p+) was followed by a masked phosphorus (n+) implant to counterdope the boron existing in the n+ source and drain regions. This, however, has required excessive quantities of phosphorus to be used to insure complete counterdoping of the boron.

It would therefore be advantageous to have a method for production of CMOS devices which would allow for elimination of masking steps while still providing a means of reducing hot-electron effects. It would also be advantageous for such method to permit elimination of an n+ layer without increasing the n-channel S/D contact resistance. It is to this end that the present invention is directed.

SUMMARY OF THE INVENTION

In its broadest concept, the present process comprises the use of a blanket phosphorus (n−) implant coupled with a masked boron (p+) implant to permit the elimination of the conventional n+ implant and the LDD masks. The use of the blanket n− implant and the masked p+ implant allows production of an n− drain region which reduces hot-electron-induced degradation and a low concentration S/D region which is subsequently more easily counterdoped by a high concentration implant. A shallow blanket n+ implant is included prior to the p+ mask step to prevent contact resistance problems. Thereafter in the process of this invention, a salicide is formed at the sources and drains to produce a low sheet resistance in the contacts of the n-channel devices, notwithstanding the absence of the conventional thick n+ layer.

After completion of a standard CMOS self-aligned gate process through formation of the gate structures, sequential low-energy blanket implants of n-type dopants are performed. A low dosage implant of a first n-type dopant is completed before formation of spacers adjacent to exposed edges of the gate structures. After formation of the spacers, a medium dosage implant of a second n-type dopant is performed. A high energy, high dosage implant of p-type dopant is performed into p-channel regions exposed by a p+ mask of photoresist which creates the source/drain regions of the p-channel devices by counterdoping the prior n-type blanket implants. A salicide is formed in the active areas to provide low contact resistance.

BRIEF DESCRIPTION OF THE DRAWING

FIGS. 1A–1L of the drawing show a flow diagram illustrating the sequence of steps in the production process of the present invention.

DETAILED DESCRIPTION AND PREFERRED EMBODIMENTS

Figure 1A:
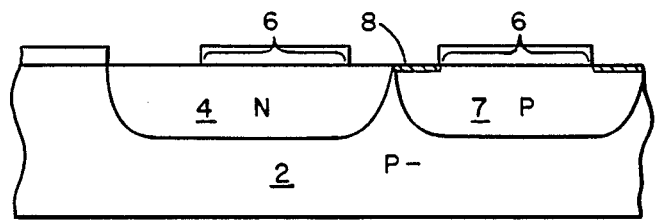
Figure 1B:
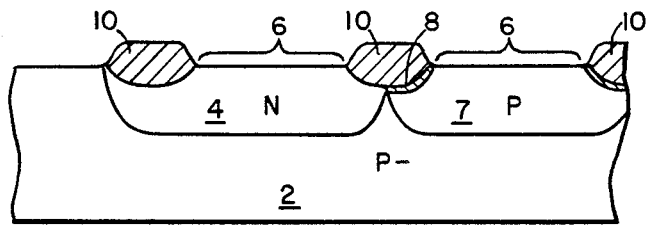
Figure 1C:
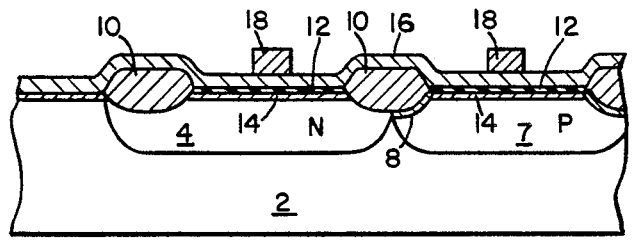
Figure 1D:
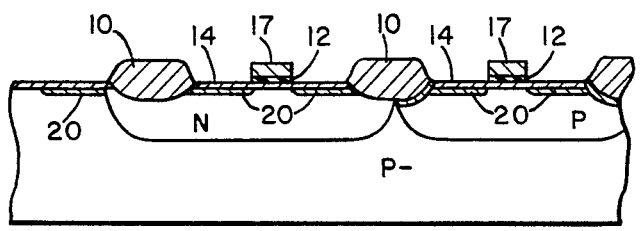
Figure 1E:
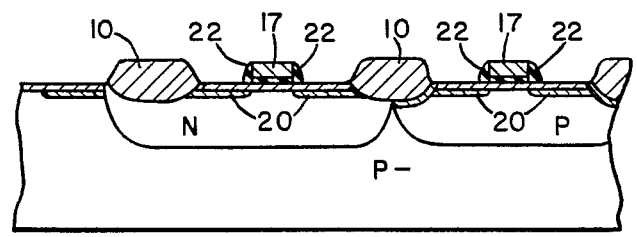
Figure 1F:
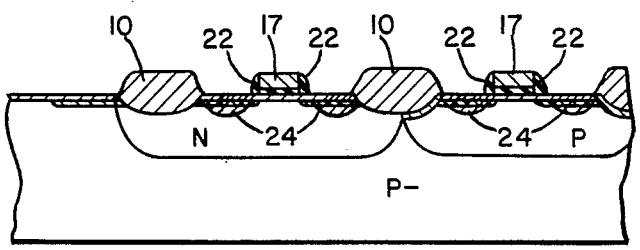
Figure 1G:
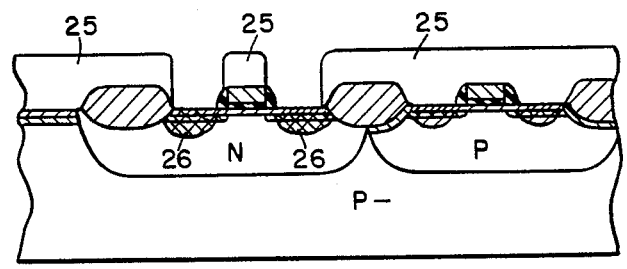
Figure 1H:
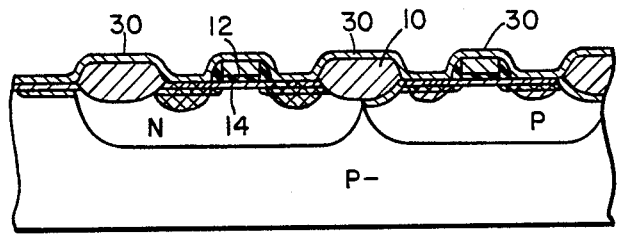
Figure 1J:
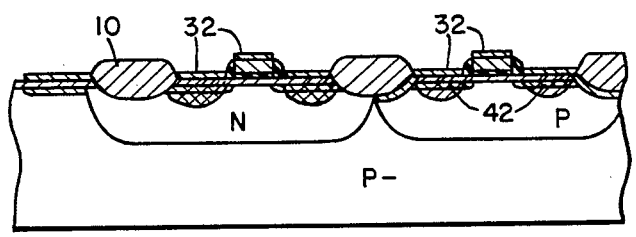
Figure 1K:
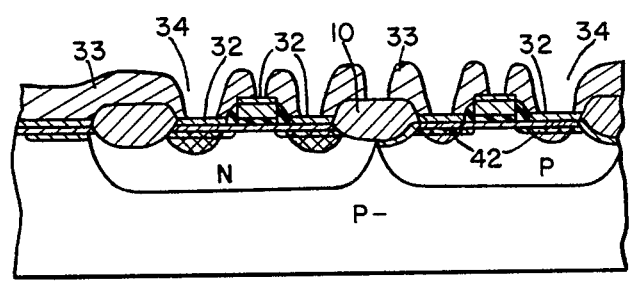
Figure 1L:
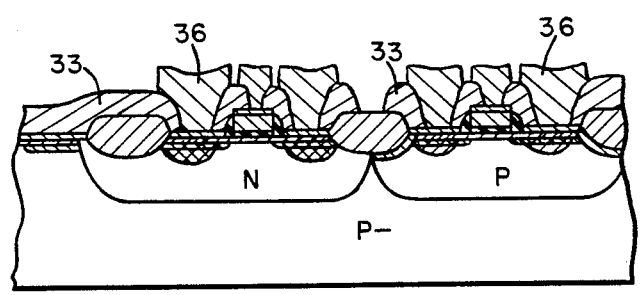

The process of this invention can be best understood by reference to FIGS. 1A–1L. The process for fabrication of self-aligned MOS devices is well known to those skilled in the art. Therefore, the process steps prior to the description of the present invention will not be detailed, but are merely included to complete the process flow. The proposed process incorporates several novel steps which markedly improve the ease of production while yielding a CMOS device which has operating characteristics equivalent to or better than devices made by conventional processes.

The present process starts with a p-type substrate 2 as illustrated in FIGS. 1A–1L. The preferred embodiment uses a twin well process. The n-well 4 is formed by an n− implant into the area exposed by selective removal of a composite layer of thin $SiO_2$ and $Si_3N_4$. A thick oxide is grown in the n+ area, after which the $Si_3N_4$ is stripped. A p-well 7 is formed by implant into the area where the $Si_3N_4$ was etched away. The n− area is masked against the p− implant by the thicker oxide. All oxides are then stripped and the two wells are driven in.

A first alternate embodiment is the formation of only an n-well in a p-type substrate. The "p-well" in this case would simply be the area which was not exposed during n−implant. A second alternate embodiment would involve starting with a n-type substrate. A p-well would be formed using a similar masking step through which a p-type dopant would be implanted. Both alternate embodiments are widely used in the industry, however, excessive doping effects involved in single-well processes leads to the preference of a twin well process for the present invention. The active regions 6 are subsequently defined by use of a composite-$Si_3N_4$ mask, and then are followed by p-field implant 8 using a field implant blocking mask.

Device isolation is achieved by field oxidation 10 of non-active areas through a mask of oxidation-inhibiting silicon nitride, or a composite thereof. Following removal of the silicon nitride, a gate oxide 12 is grown in the active areas, followed by a $V_t$ channel implant 14. Polysilicon 16 is deposited and doped, and is etched as defined by the polysilicon mask 18 to form the gate structures 17. All steps to this point are conventional for CMOS self-aligned gate technology. Slight variations in this procedure may be anticipated and will not limit the scope of the invention.

It is at this point that the present process diverges from the conventional CMOS production techniques of the prior art. An LDD layer 20 is formed by a blanket n− implant of phosphorus. A low temperature oxide is deposited followed by anisotropic etching to form oxide spacers 22 over the LDD layer, adjacent to the edges of the gate structures 17, per conventional techniques. The oxide spacer 22 serves the dual purpose of defining the LDD regions and, later, as a mask to prevent silicide formation too near the gate so as to prevent gate to source and/or drain shorts.

The next new step in the process is the formation of a shallow blanket n+ implant of arsenic 24. This provides for low contact resistance in the n-channel devices. Photoresist 25 is spun on the substrate and patterned to expose the p+ contact areas. A high dose p+ implant 26 is performed, resulting in counterdoping of the exposed areas which previously received the blanket n− and n+ implants 20 and 24. For the purpose of this process, a "low" dosage is defined as a dosage of $<10^{13}$ atoms/cm$^2$, a "medium" dosage as $10^{13}$–$10^{15}$ atoms/cm$^2$ and a "high" dosage as $>10^{15}$ atoms/cm$^2$.

Thereafter, the structure is subjected to rapid thermal annealing (RTA) to drive in the implants and activate the dopants. Furnace annealing at 900° C. for approximately 80 minutes provides the same degree of dopant activation and counterdoping, however, RTA is preferred in order to minimize diffusion of the junctions.

A thin film of titanium 30 is deposited and the source/drain regions are heat treated to form a salicide 32 of $TiSi_2$. The titanium 30 does not react where it is deposited on oxide, specifically over field oxide 10 and oxide spacers 22. The unreacted titanium is subsequently removed. The salicide 32 produces low sheet resistance in all contacts, however, the low resistance in the n-channel contacts 42 is primarily due to the n+ blanket implant 24 and not the salicide 32 alone.

A low temperature dielectric film 33 is deposited and patterned with photoresist through which contact openings 34 are etched. Interconnect 36 is achieved using conventional procedures of metal deposition and patterning.

By means of this technique, the need to use n+ and LDD masks is eliminated. The inclusion of the shallow n+ layer also eliminates the high contact resistance problem which would otherwise have been present because of use of an n-phosphorus layer alone.

Specific examples derived from experimental results will illustrate process of this invention. The initial n− phosphorus implant has a dose of $1 \times 10^{14}$ atoms/cm$^2$ and an energy of 30 KeV. This implant dose provides a low peak substrate current and good hot-electron-resistant performance. It is contemplated that doses in the range of $9 \times 10^{13}$ to $4 \times 10^{14}$ atoms/cm$^2$ will be suitable for use, with the preferred ranges being $1 \times 10^{14}$ to $3 \times 10^{14}$ atoms/cm$^2$. The low implant energy is necessary to form the shallow n-channel S/D junction to be subsequently counterdoped by the p+ implant 26. The implant energies must be kept low for this reason, and will normally be in the range of 30 to 50 KeV, preferably 30 to 40 KeV.

The formation of the n− layer 20 was followed by formation of an oxide spacer, which in turn was followed by a shallow blanket n+ implant 24 needed to reduce or prevent contact resistance problems. An arsenic dose of $7.5 \times 10^{14}$ atoms/cm$^2$ and an energy of 25 KeV was used. This provided a dose high enough to form the ohmic S/D contacts in the n-channels but low enough to be easily counterdoped subsequently by the $BF_2$ p+ implant. Generally the n+ implantation will be conducted with doses of $5 \times 10^{14}$ to $9 \times 10^{14}$ atoms/cm$^2$ and energies of 25 to 40 KeV. The optimum doses and energies will be determined from the constraints mentioned above.

In this experiment the shallow n-channel S/D region was subsequently counterdoped with a $BF_2$ p+ implant of $5 \times 10^{15}$ atoms and with an energy of 50 KeV. In the further salicide step the Ti thickness formed was 700Å.

The device characteristics of a CMOS device made by the process of this invention are given in the Table below, derived from tests of 100/1 μm MOSFET's.

TABLE

| | n-channel | p-channel |
|---|---|---|
| $V_t$, V | 0.70 | −0.86 |
| M-factor$^a$, $V^{0.5}$ | 0.52 | −0.37 |
| $5 \times 5$ I$^b$, mA | 24.6 | 15.6 |
| $BV_{dss}$, V | 14.4 | −12.2 |
| $I_{sx}(max)^c$, μA | 31.5 | 0.15 |
| Beta$^d$(4V), μA/V$^2$ | 68 | 20.2 |
| | Sheet Resistance, ohm/square | Junction Depth, μm |
| n+ | 3.2 | 0.14 |
| p+ | 4.3 | 0.21 |
| polysilicon, n+ | 2.5 | — |
| n− | 2400 | 1.7 |

Notes:
$^a$Body effect
$^b$Saturation current where $V_D = V_G = 5$ V
$^c$Peak substrate current
$^d$"Beta-Factor" = $\mu C_{ox}$, where $\mu$ = mobility and $C_{ox}$ = gate oxide capacitance It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A method of manufacturing a double-diffused drain CMOS device comprising the steps of:
    performing sequential low-energy blanket implants of n-type dopant of low and medium dosages into a substrate before and after formation of spacers adjacent to exposed edges of a plurality of gate structures;

performing a medium energy, high dosage implant of p-type dopant into p-channel regions of said substrate, said p-channel regions comprising areas exposed by a p+ mask, which also defines n-channel regions as regions not exposed by said p+ mask which previously received said blanket implants; and forming a salicide in said p-channel and said n-channel regions by depositing a metal and exposing said substrate to temperature treatment.

2. A method as defined in claim 1 wherein said n-type dopant with which said low energy, low dosage blanket implant is performed prior to spacer formation is phosphorous, with dosage in the range of $9 \times 10^{13}$ to $4 \times 10^{14}$ atoms/cm$^2$ and energy in the range of 30 to 50 KeV.

3. A method as defined in claim 1 wherein said n-type dopant with which said low energy, medium dosage blanket implant is performed after spacer formation is arsenic, with dosage in the range of $5 \times 10^{14}$ to $9 \times 10^{14}$ atoms/cm$^2$ and energy in the range of 25 to 40 KeV.

4. A method as defined in claim 1 wherein said p-type dopant with which said high dosage, medium energy p+ implant is performed is BF$_2$, with dosage in the range of $4 \times 10^{15}$ to $1 \times 10^{16}$ atoms/cm$^2$ and energy in the range of 45 to 60 KeV.

5. A method as defined in claim 1 wherein said metal used to form said salicide is titanium, thereby creating TiSi$_2$.

6. A method as defined in claim wherein temperature treatment is performed after said p-type implant to anneal implant damage and activate said dopants.

7. A method as in claim 6 wherein said temperature treatment is rapid thermal annealing.

8. A method as defined in claim 1 wherein said spacers are formed of oxide and are of sufficient width to prevent gate to source/drain shorts when said salicide is formed.

9. A method as defined in claim 1 wherein said spacers are of appropriate width to minimize hot-electron effects.

10. In a method of manufacturing a double-diffused drain CMOS device comprising a semiconductor substrate containing one impurity type into which an implant of the opposite polarity type is performed through the exposed area of a composite mask to form a plurality of wells; removing the mask and performing an implant of the same polarity type as that in the substrate; defining a plurality of active regions within the n- and p-wells wherein the intended carrier charge of each active region is opposite in polarity to the well into which it is disposed; growing an isolating thermal oxide; performing a threshold voltage-determining implant and growing a gate oxide in the active regions; forming gate structures overlying portions of the active regions; forming contacts through a low temperature dielectric film deposited over the substrate by etching areas exposed by a contact mask; and forming a metal interconnect through which access to the device may be achieved;

the improvement which comprises:

performing a low energy blanket implant of a low dosage of a first type of n-type dopant following the formation of doped polysilicon features;

forming spacers adjacent to exposed edges of said gate structures;

performing a low energy blanket implant of a medium dosage of a second type of n-type dopant;

performing a medium energy, high dosage implant of p-type dopant into p-channel regions exposed by a p+ mask; and forming a salicide in the p-channel and n-channel active regions by depositing a metal and exposing said substrate to a siliciding temperature treatment.

11. The improvement as defined in claim 10 wherein said n-type dopant with which said low energy, low dosage blanket implant is performed prior to spacer formation is phosphorous, with dosage in the range of $9 \times 10^{13}$ to $4 \times 10^{14}$ atoms/cm$^2$ and energy in the range of 30 to 50 KeV.

12. The improvement as defined in claim 10 wherein said n-type dopant with which said low energy, medium dosage blanket implant is performed after spacer formation is arsenic, with dosage in the range of $5 \times 10^{14}$ to $9 \times 10^{14}$ atoms/cm$^2$ and energy in the range of 25 to 40 KeV.

13. The improvement as defined in claim 10 wherein said p-type dopant with which said high dosage, medium energy p+ implant is performed is BF$_2$, with dosage in the range of $4 \times 10^{15}$ to $1 \times 10^{16}$ atoms/cm$^2$ and energy in the range of 45 to 60 KeV.

14. A method as defined in claim 10 wherein said metal used to form said salicide is titanium, thereby creating TiSi$_2$.

15. The improvement as defined in claim 10 wherein temperature treatment is performed after said p-type implant to anneal implant damage and activate said dopants.

16. The improvement as in claim 15 wherein said temperature treatment is rapid thermal annealing.

17. The improvement as defined in claim 10 wherein said spacers are formed of oxide and are of sufficient width to prevent gate to source/drain shorts when said salicide is formed.

18. The improvement as defined in claim 10 wherein said spacers are of appropriate width to minimize hot-electron effects.

* * * * *